US006475841B1

(12) United States Patent
Taylor, Jr. et al.

(10) Patent No.: US 6,475,841 B1
(45) Date of Patent: Nov. 5, 2002

(54) TRANSISTOR WITH SHAPED GATE ELECTRODE AND METHOD THEREFOR

(75) Inventors: William J. Taylor, Jr., Austin, TX (US); Srikanth B. Samavedam, Austin, TX (US); Nigel Cave, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/584,963

(22) Filed: Jun. 2, 2000

(51) Int. Cl.$^7$ .................. H01L 21/311; H01L 21/461
(52) U.S. Cl. .................. 438/197; 438/735; 438/738
(58) Field of Search .................. 438/301, 535, 438/305, 591, 701, 532, 705, 197, 549, 735, 738; 430/5

(56) References Cited

U.S. PATENT DOCUMENTS

| | | | | |
|---|---|---|---|---|
| 4,026,733 A | * | 5/1977 | Owen, III et al. | 438/301 |
| 4,330,931 A | * | 5/1982 | Liu | 438/301 |
| 4,438,556 A | * | 3/1984 | Komatsu et al. | 438/532 |
| 4,634,494 A | * | 1/1987 | Taji et al. | 438/705 |
| 4,696,877 A | * | 9/1987 | Matsui et al. | 430/5 |
| 4,718,973 A | * | 1/1988 | Abraham et al. | 438/535 |
| 5,783,478 A | | 7/1998 | Chau et al. | 438/592 |
| 5,834,817 A | * | 11/1998 | Satoh et al. | 257/387 |
| 6,124,177 A | * | 9/2000 | Lin et al. | 438/305 |

OTHER PUBLICATIONS

T. Ghani et al., "100 nm Gate Length High Performance/Low Power CMOS Transistor Structure", 1999 IEDM, pp. 17.1.1–17.1.4.

M. Zhang et al., "Reactive ion etching for submicron structures of refractory metal silicides and polycides", pp. 1037–1041.

C. Monget et al., "Germanium etching in high density plasmas for 0.18 μm complementary metal–oxide–semiconductor gate patterning applications", 1998 American Vacuum Society Technology B, vol. 16, No. 4, Jul./Aug. 1998, pp. 1833–1840.

S. Vallon et al., "Polysilicon–germanium gate patterning studies in a high density plasma helicon source", 1997 American Vacuum Society Technology A 15(4), Jul./Aug. 1997, pp. 1874–1880.

* cited by examiner

*Primary Examiner*—Wael Fahmy, Jr.
*Assistant Examiner*—William David Coleman
(74) *Attorney, Agent, or Firm*—James L. Clingan, Jr.

(57) ABSTRACT

A transistor structure includes a retrograde gate structure (112) that is narrower at the end that interfaces with the gate dielectric (120) than it is at the opposite end and method for manufacture of such a structure. The retrograde gate structure (112) is formed by depositing a layer of gate material (104) that has varying composition in the vertical direction. The differentiation in composition causes varying lateral etch rate characteristics along the vertical direction of the gate structure (112) such that increased etching of the gate material (104) occurs near the interface with the gate dielectric layer (102).

16 Claims, 3 Drawing Sheets

TRANSISTOR WITH SHAPED GATE ELECTRODE AND METHOD THEREFOR

FIELD OF THE INVENTION

The invention relates generally to semiconductor devices, and more particularly to a transistor having a shaped gate electrode structure.

RELATED ART

In many prior art semiconductor transistors a generally uniform vertical gate profile was often desired. This is due to the fact that a generally uniform vertical gate would reduce parasitic electric effects associated with non-vertical gate profiles. Conventional etching techniques result in slight lateral etching at the top of the gate because the masking layer is gradually eroded during the etch. This results in a slight taper of the gate (narrow at the top, wide at the bottom near dielectric). This is undesirable, since the top is typically silicided, and narrowing here limits electrical conduction. Also, due to concerns with over etching of the underlying gate dielectric or substrate, etching processes had to be closely controlled to minimize such potentially damaging over etching conditions. As such, tapered regions or "feet" that extend horizontally from the generally vertical gate profile could result at the interface of the gate and the underlying gate oxide. These tapered regions are undesirable due to the additional parasitics that they introduce, where one such additional parasitic is an increase in the Miller capacitance of the transistor.

Although generally vertical gate profiles do reduce some parasitics, such profiles limit the potential for optimization of the device architecture in which they are included. Such optimizations can be based on different implantation steps, where some of these implementation steps may utilize angular implantation. Due to the generally vertical profile of the gate structure, closely spaced devices can limit the angle with which such angular implantation steps can be performed. In many cases, the offset between different implantation steps is important, and the limitation of the maximum angle with which specific angular implantation steps can be performed restricts the maximum offset that can be achieved between different implantation steps. This problem is compounded as device densities on integrated circuits continue to increase.

Therefore, gate structures that allow for more selective and controllable etching operations as well as increased effective angles of implantation are desired.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Generally, the present invention provides a transistor structure that includes a retrograde gate electrode structure that is narrower at the end that interfaces with the gate dielectric than it is at the opposite end. The invention further includes techniques for forming such retrograde gate structures. In one embodiment, the retrograde gate structure is formed by depositing a layer of gate material that has varying composition in the vertical direction. The differentiation in composition causes varying lateral etch rate characteristics along the vertical direction of the gate structure such that increased etching of the gate material occurs near the interface with the gate dielectric. In other embodiments, doping techniques or other material infusion techniques can be used for altering the composition of a deposited layer of gate material such that the lateral etch rate characteristics of the gate material layer are altered. In yet other embodiments, multiple masking and doping operations can be utilized to infuse the appropriate dopant materials corresponding to different types of devices commonly included in integrated circuits.

Modification of the etch rate characteristics of the gate material allows for improved control of etching of the gate to generally reduce or eliminate the undesirable narrowing at the top of the gate, and to eliminate the tapered portions (feet) present in prior art devices. A further advantage is realized in angular implantation operations where the retrograde gate structure enables such angular implantation steps to be performed in a manner that allows greater differentiation between angular implantation and vertical implantation.

The invention can be better understood with reference to FIGS. 1–15. FIGS. 1–9 concern creation of a transistor device that includes a retrograde gate structure, where the retrograde gate structure is formed through deposition of a layer of gate material of varying composition. FIGS. 10–15 concern the creation of transistor structures utilizing a multilayered approach to formation of the gate material layer, where such multilayered techniques can be configured to allow for formation of the appropriate gate material for different types of transistors.

Figure 1:
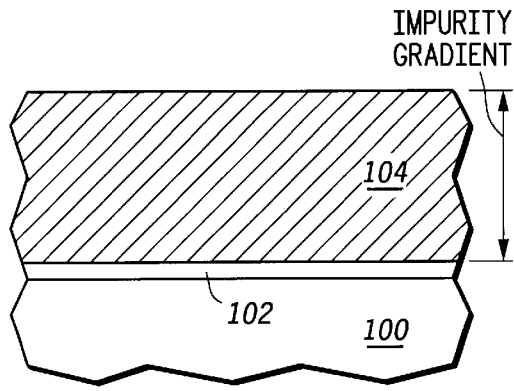
FIG. 1 includes an illustration of a portion of a semiconductor substrate upon which gate material of varying composition has been formed in accordance with a particular embodiment of the present invention.

FIG. 1 illustrates an underlying substrate 100 upon which a gate dielectric layer 102 has been formed. The substrate 100 has at least a semiconductor portion, where the semiconductor portion may be silicon or other semiconductive materials such as silicon on insulator (SOI), germanium, or various combinations of semiconductor materials. In one embodiment, the substrate 100 is a silicon wafer. The semiconductor portion of the substrate 100 includes a surface upon which a gate dielectric layer 102, which may also be referred to as an insulating layer or gate insulator, is formed. The gate dielectric layer 102 may be formed on the surface of the substrate 100 through standard techniques such as thermal oxidation, or chemical or physical vapor deposition.

A gate material layer of varying composition 104 is formed overlying the gate dielectric layer 102. The gate material layer of varying composition 104 preferably includes polysilicon; amorphous silicon; silicon combined with germanium or carbon; or silicon combined with elements (commonly referred to as dopants in silicon) such as boron, phosphorus, indium, gallium, or arsenic. Also, gate materials that include metals can be used. As is apparent to one of ordinary skill in the art, other suitable gate materials commonly used in semiconductor device manufacturing could also be used.

An impurity gradient has been labeled in the figures to show the varying composition within the layer of gate material of varying composition 104. The impurity gradient corresponds to the concentration profile of the impurity within the gate material layer of varying composition 104. The concentration profile of the impurity varies with distance from the surface of the surface of the substrate 100. In some embodiments, a higher concentration of an impurity, or selected etch rate modification material, exists at the interface between the gate material and the underlying gate dielectric layer 102. In other embodiments, a lower concentration of the impurity exists at the interface between the gate material and the underlying gate dielectric layer 102. This is because in some embodiments higher impurity concentration results in enhanced etch rates, whereas in other embodiments higher impurity concentrations inhibit the effective etch rates in those regions.

The concentration profile of the impurity within the gate material of varying composition 104 may be a step gradient or a continuous gradient, where the gradient may be generally linear or non-linear. In one embodiment, the concentration profile of the impurity varies substantially continuously with distance from the surface of the substrate 100 by a plurality of steps of changes in concentration of the impurity. In another embodiment, the concentration profile of the impurity varies linearly with distance from the surface of the substrate 100. In other embodiments, both composition and concentration of impurities may vary within the gate material of varying composition 104. In other words, etch rate enhancing impurities may be present in one portion of the gate material of varying composition 104, whereas in other portions etch rate inhibiting impurities may be present.

The gate material may include amorphous or polysilicon gate materials, and in such cases, the impurities used to produce the impurity gradient in such materials may include arsenic, phosphorous, boron, indium, gallium, germanium, or the like. The presence of such impurities in the gate material alters the etch rate characteristics of the gate material in the lateral direction such that etching operations can be more closely controlled. In some. embodiments, this added control over etching operations may be used to facilitate the creation of a generally vertical gate structure that is often desired for transistor construction. In other embodiments, the added control over etching of the gate material is used to create retrograde gate structures that provide the advantages associated with angular implant operations and reduced gate lengths at the gate dielectric interface as described above. A further advantage is realized in that photolithographic tools of limited resolution can be used to pattern gate structures, where the resulting gate structure following the controlled etching operations has a gate length that is shorter than the shortest gate length that can normally be achieved based on the limited capabilities of the photolithographic equipment.

The layer of gate material of varying composition 104 can be formed utilizing conventional polysilicon or amorphous silicon deposition operations that are modified to include an influx of the desired impurity or impurities. The influx of impurities can be regulated in a closely controlled manner to ensure that the concentration of impurities at different levels within the gate material of varying composition 104 is accurately achieved. In an example embodiment, a silicon containing gas is flowed into a chamber under controlled conditions to grow the gate material, and a inflow of suitable impurity gas is supplementally flowed into the chamber to produce the impurity gradient. The supplemental flow of the impurity gas is done in a regulated fashion such that the inclusion of such impurities throughout the gate material is controlled to achieve the desired concentration gradient. In other embodiments, the layer of gate material of varying composition 104 may be performed through a number of sequential deposition or formation operations where each deposition operation deposits gate material having a different concentration of impurity or impurities. In yet another embodiment, the impurity gradient profile in the gate material 104 may be achieved by one or more successive ion implantation steps.

Figure 2:
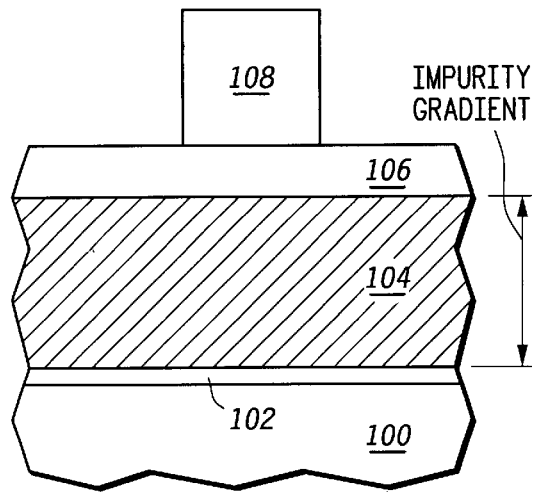
FIG. 2 includes an illustration of the structure of FIG. 1 following steps associated with gate patterning in accordance with a particular embodiment of the present invention.

FIG. 2 illustrates the structure formed in FIG. 1 following the additional formation of an overlying anti-reflective coating layer (ARC) layer 106 and a patterned photoresist layer 108. Techniques for formation of such layers are commonly known in the art. Such layers are used to provide the patterning necessary to initiate formation of a gate structure utilizing the gate material of varying composition 104. As such, the patterned photoresist layer 108, or mask, provided overlying the gate material layer 104 defines a gate under the mask. The gate defined under the mask as an upper portion that is near the mask and a lower region that is near the surface of the substrate 100.

Figure 3:
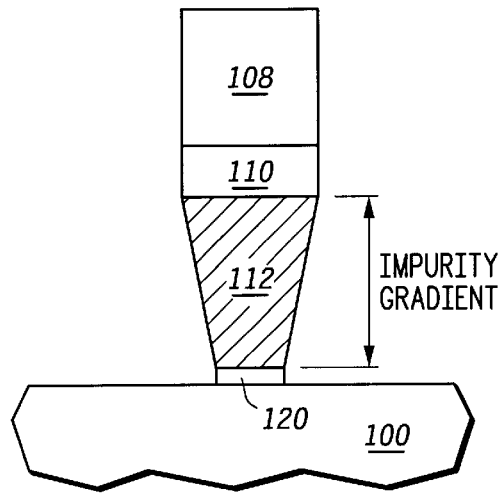
FIG. 3 includes an illustration of the structure of FIG. 2 following etching operations that result in a gate structure having a retrograde profile in accordance with a particular embodiment of the present invention.

FIG. 3 illustrates the structure of FIG. 2 following etching operations that result in the retrograde gate structure 112, an underlying gate dielectric portion 120, and a remaining portion of the ARC layer 110. The etching operations utilized to generate the. structure illustrated in FIG. 3 are preferably etching operations that result in a variance in the lateral etch rate along the vertical dimension of the layer of gate material of varying composition 104. In the example illustrated in FIG. 3, a generally linear impurity gradient within the gate material of varying composition 104 is assumed. Note that in other embodiments, a staircase like pattern may be created if coarse, step-like differentiations in impurity concentration are utilized to create the impurity gradient. Depending on the impurity profile design and the etch rate dependence on the impurity concentration, the gate structure 112 might also have a concave profile after the etching operations. The concave profile results in the upper regions of the gate structure 112 being wider than the lower portions, where the lower portions are at the interface between the gate material and underlying gate dielectric portion 112.

The etching operations used in generation of the structure of FIG. 3 are preferably designed to correspond to the type of impurity used altering the composition of the gate material. For example, if etch enhancement is intended by inclusion of specific impurities, the etch operations should be optimized to account for the specific impurities used. In a particular embodiment where the gate material layer 104 is polysilicon, the etching material used to perform the etching operations is selected such that the etch rate of the polysilicon is affected by the inclusion of the impurity in the polysilicon.

In one embodiment, the gate material of varying composition is polysilicon that has been infused with varying concentrations of germanium. Germanium acts as an etch rate enhancer for some etching operations, and as such, the concentration of germanium should be greater at the interface between the gate material and the underlying gate dielectric portion 120 such that the lateral etch rate is greater at the interface between these two layers. As such, the germanium concentration is less at the opposite end of the retrograde gate structure 112 (the upper region of the retrograde gate structure 112) such that etching operations occur more slowly at that end. Slower etching operations will generally preserve the length of the gate structure to aid in the production of the retrograde gate structure. As such, the result of the etching operations is the retrograde gate structure 112 where the upper region of the gate is wider than the lower region of the gate.

A longer surface in the upper region of the retrograde gate structure 112 provides a better surface at which additional layers of interconnect may couple to the retrograde gate structure to provide the electrical signals that control the transistor operation. A salicide layer may be provided on the gate that is aligned with the upper region of the gate-so as to be wider than the lower region of the gate. The salicide layer provides electrical contact between the gate and other portion of the integrated in which the transistor is included. Because the salicide layer is wider than the lower region of the gate, it provides lower resistance conduction of electrical current than if it were only as wide as the lower region of the gate.

Figure 4:
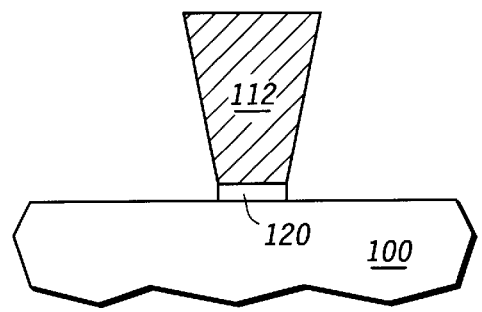
FIG. 4 includes an illustration of the structure of FIG. 3 following removal of layers associated with gate patterning in accordance with a particular embodiment of the present invention.

FIG. 4 illustrates the structure of FIG. 3 following subsequent removal of the patterned photoresist 108.and the remaining portion of the ARC layer 110. The removal of the patterned photoresist 108 and the remaining portion of the ARC layer 110 can be accomplished through using standard processing techniques known in the art.

Figure 5:
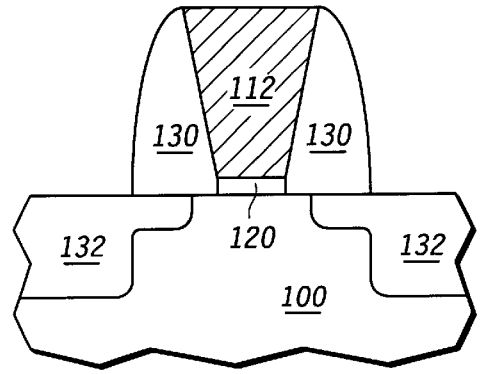
FIG. 5 includes an illustration of the structure of FIG. 4 following additional steps associated with transistor formation in accordance with a particular embodiment of the present invention.

FIG. 5 illustrates the structure of FIG. 4 following the implantation of source and drain regions 132 and the formation of spacers 130. Note that the implantation of the source and drain regions 132 is typically accomplished using vertical implantation techniques commonly used in the art. Formation. of the source and drain regions 132 defines a channel region that lies between the source and drain regions. Several operations are typically required to form the source and drain regions 132, where extension portions of the source and drain regions 132 are typically formed prior to the formation of the sidewall spacers 130. These extension regions are normally formed by performing a relatively light dose implant through the surface of the substrate 100 to form a light implant region that is aligned with an edge of the upper region of the gate. Following formation of the sidewall spacers 130, deeper portions of the source and drain regions 132 are added by performing a relatively heavy dose implant through the surface of the substrate 100 using the sidewall spacers 130 to mask the relatively heavy dose implant.

As is illustrated, the extension portions of the source and drain regions 132 do not extend all the way to the edges of the remaining portion of the gate dielectric 120. As such, when subsequent heating operations used in device processing heat the substrate 100, the migration of the dopant included in the extension regions cause these regions to grow outward toward the edges of the remaining portion of the gate dielectric 120. The result of this diffusion is a relatively small overlap of the extension region with the lower region of the gate (i.e. the extension region may extend slightly beneath the gate). This differs from prior art systems with generally vertical gate structures in that the implantations steps corresponding to the formation of extension regions in such prior art systems result in extension regions that are initially aligned with the outer edges of the remaining portion of the gate dielectric (the gate). As such, subsequent heating operations cause migration of the extension regions such that portions of these extension regions underlie the gate. The structures resulting from these prior art techniques include undesirable parasitics that degrade device performance. Although some prior art processing systems attempt to alleviate such parasitics through additional processing steps, these processing steps add both cost and complexity to the overall process methodology. Similarly, these additional processing steps can lose their effectiveness in minimizing the undesirable parasitics as gate lengths continue to decrease.

As is apparent to one of ordinary skill in the art, the profile of the retrograde gate structure 112 can be controlled such that the difference between the length of the portion of the gate structure at the gate dielectric interface and the length of the gate structure at the opposite end is correlated to the expected expansion of the implanted extension regions due to subsequent thermal operations. As such, the positioning of the resulting extension regions with respect to the gate can be closely controlled. As is also apparent to one of ordinary skill in the art, retrograde structures can be combined with other prior art techniques in order to ensure parasitics are minimized for reduced gate length devices.

Figure 6:
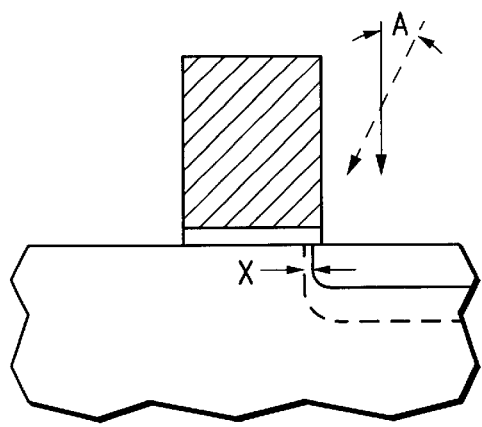
FIG. 6 includes an illustration of a device substrate undergoing implantation steps in accordance with prior art techniques.

FIG. 6 illustrates a prior art gate structure, where the illustration highlights the limitations placed on angular implantation techniques in such prior art devices. Angular implantation steps are often used to include halo structures that are associated with further optimization of the performance of transistor devices beyond those improvements achieved through the inclusion of extension regions in the source and drain portion. The use of such halo structures is most beneficial when a sharp junction between the halo structures and the extension regions exist.

A greater angle of implantation, or greater tilt angle, of such halo implant results in a greater offset between the extension and halo regions. However, the density of devices on integrated circuits often limits the maximum tilt angle that can be achieved in such angular implantation operations. This is due to the shadowing effect of neighboring structures or neighboring photoresist layers on the integrated circuit when the angular implantation step occurs. For example, photo resist used to pattern the integrated circuit such that angular implantation only occurs in specific areas can often limit the maximum tilt that can be achieved. In the prior art example illustrated in FIG. 6, the maximum tilt angle "A" allows for an offset between the extension region and the halo region equal to a measure "X".

Figure 7:
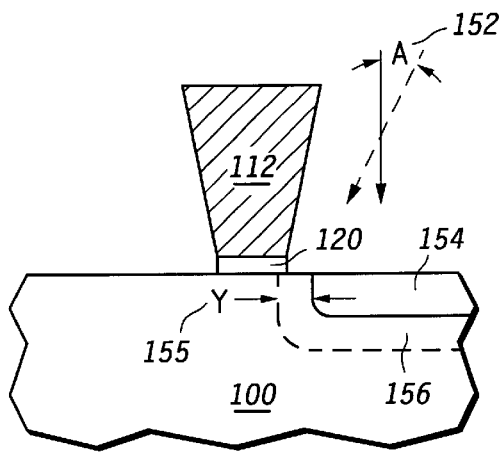
FIG. 7 illustrates the structure of FIG. 4 undergoing implantation steps that include both vertical and angled implantation in accordance with a particular embodiment of the present invention.

FIG. 7 illustrates the advantages of the retrograde gate structure 112 with regard to angular implantation operations. Although the maximum tilt, as shown by the angle "A" 152, is the same as could be achieved with respect to the prior art structure in FIG. 6, a greater offset "Y" 155 can be achieved between the extension region 154 and the halo region 156. This is due to the fact that the vertical implantation step associated with formation of the extension region 154 is limited by the upper region of the retrograde gate structure 112, whereas the formation of the halo region 156 is limited by (masked by) the lower region of the retrograde gate structure 112 at the point where it contacts the remaining portion of the gate dielectric 120. The offset can be closely controlled based on the height of the retrograde gate structure 112 as well as the angle associated with the sides of the retrograde gate structure 112.

Figure 8:
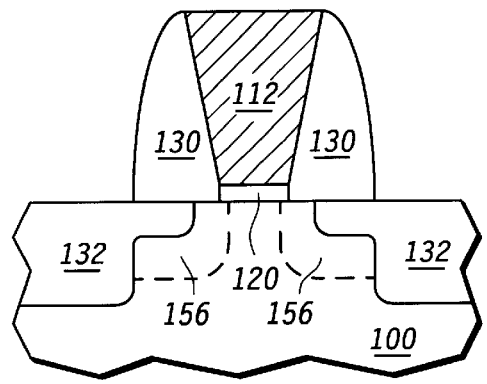
FIG. 8 illustrates a nearly completed transistor structure that includes the retrograde gate structure as well as initial implantations in accordance with a particular embodiment of the present invention.

FIG. 8 illustrates a portion of a transistor structure resulting from the various steps described with respect to FIGS. 1–5 and 7. FIG. 8 includes the halo structures 156 that are not illustrated in FIG. 5, but are preferably formed utilizing the techniques described with respect to FIG. 7. Subsequent to the formation of the structure of FIG. 8, additional processing steps, such as those that involve high temperature operations, are performed to result in the structure shown.

Figure 9:
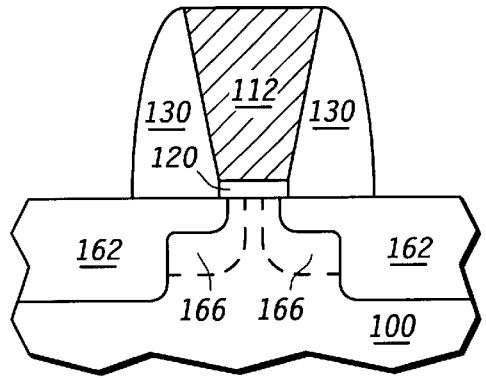
FIG. 9 includes an illustration of the structure of FIG. 8 following thermal processing steps that alter the relative positions and densities of the implant species of the initial implantations in accordance with a particular embodiment of the present invention.

Within FIG. 9, the source and drain regions 132 shown in FIG. 8 have expanded to form source and drain regions 162. Such expansion is associated with migration of dopant materials during high temperature operations, such as an annealing step. Similarly, the halo regions 156 of FIG. 8 have expanded to form the halo regions 166 illustrated in FIG. 9. The annealing step associated with the expansion of the various regions may include a number of annealing steps interspersed between different implantation operations. Additional processing steps may be used to supplement the device structure shown in FIG. 9 to create the final transistor structure. Such processing steps include the formation of active and gate salicide regions, formations of contacts to these salicide regions, and subsequent metallization used for forming interconnect on the integrated circuit.

Thus, within the transistor structure illustrated in FIG. 9, the lightly doped portions of the source and drain regions 162 are separated by a channel region, where the retrograde gate structure 112 overlies the channel region such that it slightly overlaps the channel region. The retrograde gate structure 112 has a first surface and a second surface, where the second surface is closer to the channel than the first surface. In the example illustrated, the second surface exists at the interface between the retrograde gate structure 112 and the remaining portion of the of the gate dielectric 120. The retrograde gate structure 112 includes an impurity that affects the etch rate of the material of which it is made. The concentration distribution of the impurity within the retrograde gate structure 112 causes an increase in the etch rate of the material that makes up the gate from the first surface to the second surface.

Figure 10:
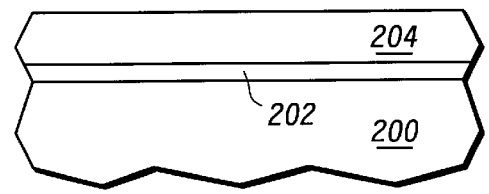
FIG. 10 includes an illustration of a device substrate upon which an initial portion of the gate material has been formed in accordance with a particular embodiment of the present invention.

Although FIGS. 1–5 and 7–9 involve a retrograde gate structure formed by selective etching of a gate material layer of varying composition, other embodiments of the present invention utilize multiple gate material layer deposition steps to achieve a similar result. FIG. 10 illustrates a substrate material 200 upon which a gate dielectric layer 202 and a first portion 204 of a gate material layer has been formed. The first portion 204 of the gate material layer may be a relatively thin polysilicon layer. As was the case with the embodiments described above, the substrate 200 may include silicon or other semiconductor materials, and the gate dielectric layer 202 (insulating layer) may include silicon oxide, nitride and silicon oxide, or other suitable gate dielectric materials that typically have a high dielectric constant.

Figure 11:
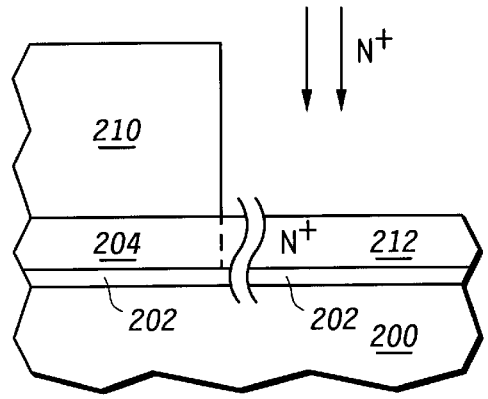
FIG. 11 includes an illustration of the structure of FIG. 10 during a first implantation step in accordance with a particular embodiment of the invention.

FIG. 11 illustrates the structure of FIG. 10 following a patterning step to form an implantation barrier 210 such that certain regions of the first portion of the gate material layer 204 are isolated for implantation. The implantation step shown in FIG. 11 involves the introduction of an impurity. In the example illustrated in FIG. 11 the impurity introduction involves N+ implantation using species such as those containing phosphorus or arsenic. The implantation results in an N+ region 212 within the first portion of the gate material layer 204.

Figure 12:
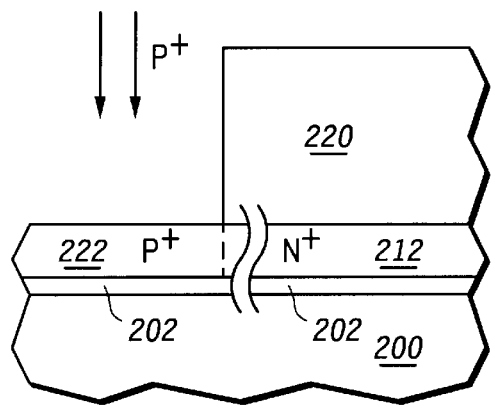
FIG. 12 illustrates an illustration of the structure of FIG. 11 during a second implantation step in accordance with a particular embodiment of the present invention.

FIG. 12 illustrates a similar implantation step involving the creation of a P+ region 222 within the portion of the gate material layer. A similar implantation barrier 220 is utilized to mask off the regions where P+ implantation is not desired.

Figure 13:
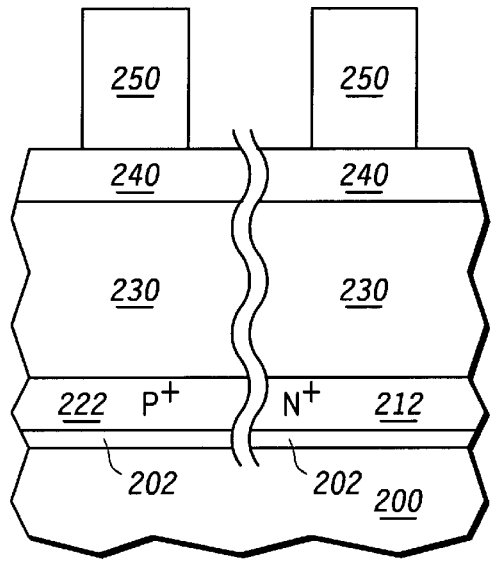
FIG. 13 includes an illustration of the structure of FIG. 12 after the additional formation of a subsequent portion of the gate material layer and layers associated with gate patterning in accordance with a particular embodiment of the present invention.

As is illustrated in FIG. 13, following creation of the N+ and P+ regions 212 and 222, a remaining portion 230 of the gate material layer is formed. The remaining portion 230 of the gate material layer is a relatively thick layer that may also be polysilicon. In one embodiment, the thickness of the P+ and N+ regions 212 and 222 of the gate material layer may be on the order of 500 angstroms, whereas the remaining portion of 230 of the gate material layer may be on the order of 1000–1500 angstroms. Note that the thickness of these different portions of the gate material layer may be adjusted to suit the processing requirements for the specific devices being fabricated.

Following completion of the gate material layer, an ARC layer 240 and a patterned layer 250 are formed to aide in gate formation. As stated earlier, such layers and their formation techniques are well known in the art. The mask formed by the patterned layer 250 defines a gate under the mask, where the gate has an upper region in the remaining portion 230 of the gate material layer (relatively thick portion) and a lower region in the first portion 204 of the gate material layer (relatively thin portion).

The differently doped regions (N+ and P+ portions 212 and 222) of the gate material layer are desirable in integrated circuits where different types of transistors are supported. For example, in a CMOS integrated circuit where both PMOS and NMOS transistors exist, NMOS transistors benefit from a gate that includes N+ doped gate material whereas PMOS transistors benefit from gate material that includes P+ doping. As is apparent to one of ordinary skill in the art, in integrated circuits that only utilize one type of transistor, or that only require gate material that includes one of N+ or P+ dopants, the multiple masking steps described with respect to FIGS. 11 and 12 may not be required.

Figure 14:
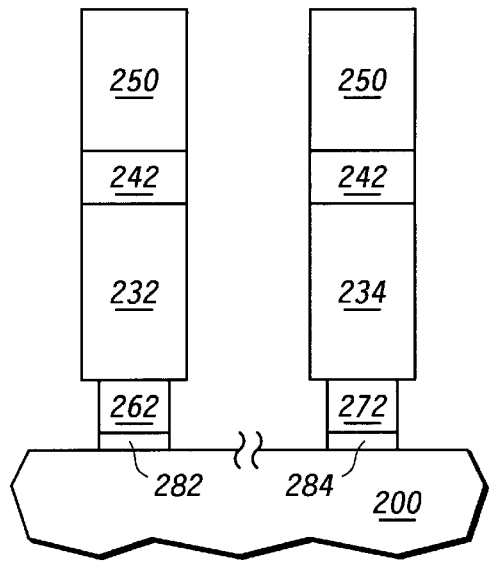
FIG. 14 includes an illustration of the structure of FIG. 13 following etching operations that generate retrograde gate structures associated with different transistor types in accordance with a particular embodiment of the present invention.

FIG. 14 illustrates the structure shown in FIG. 13 following etching operations around the edges the gate structures defined by the patterning layers (masking operation), where the etching operations generate retrograde gate structures. In the case of the retrograde gate structure that includes sections 232 and 262, the section 262 (lower region) results from the etching of the P+ region 222, whereas the section 232 (upper region) results from the etching of an overlying section of the additional portion of the gate material layer 230, where such etching operations are controlled by the patterning layers. Similarly, the retrograde gate structure that includes sections 234 and 272 results from the etching operations on the N+ region 212 and the overlying portion of the layer 230. Note that the etching operations also result in a reduction of the ARC layer 240 into individual sections 242. Similarly, the gate dielectric layer 202 is reduced to sections 282 and 284. The etching material used for the etching operations is selected such that the etch rate of the gate material is affected by the inclusion of the impurities.

The retrograde gate structures result from the difference in etching rates associated with the doped and non-doped portions of the gate material layer. Such retrograde gate structures include upper regions that are wider than their corresponding lower regions. Preferably, the alteration in etching characteristics between the P+ region 222 and the N+ region 212 are similar such that the resulting retrograde gate structures are similar in their resulting gate lengths at the interface with the sections 273 of the gate dielectric layer. Thus, the dopants used to create the P+ and N+ regions 222 and 212 also serve as etch rate enhancers that facilitate formation of the retrograde gate structures that are desirable due to the advantages described above. Note that the species of implant utilized and their concentrations in the resulting portions of the gate structures 262 and 272 can be controlled to ensure that the proper gate dimensions and electrical characteristics are achieved. Appropriate dopant materials for altering the etch rate characteristics of the lower regions of the gate structures include arsenic, phosphorus, indium, gallium, and boron, where the material selected for each implant should be selected based on whether N or P implantation is desired.

Note that due to the potential for mismatching between the etch rate modifications between the P+ and N+ regions described above, a uniform neutral etch rate modification impurity may be utilized to ensure consistent etch rate characteristic modifications between different devices. For example, an electrically neutral impurity such as germanium may be included in polysilicon or amorphous silicon gate material such that the etching characteristics of that portion of the material are altered. This can be achieved by performing a germanium implant operation in place of, or in addition to, the patterned implantation steps described in FIGS. 11 and 12 above.

Figure 15:
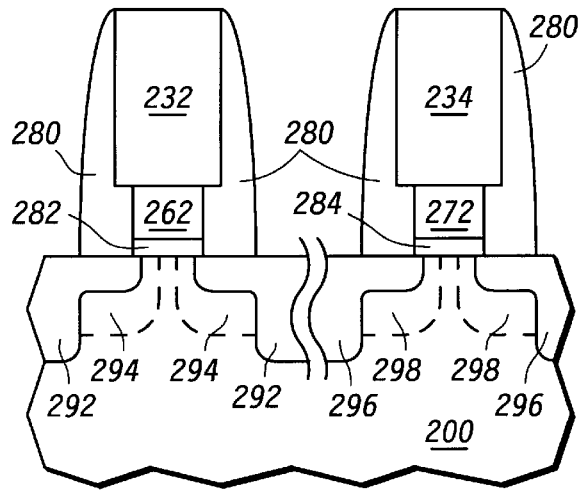
FIG. 15 includes an illustration of the structure of FIG. 14 following formation of transistors of different types that include retrograde gate structures as formed in accordance with a particular embodiment of the present invention.

Following creation of the retrograde gate structures shown in FIG. 14, subsequent processing operations are performed to generate the transistor structures illustrated in FIG. 15. The structures illustrated in FIG. 15 include spacers 280, source and drain regions 292 and 296, and halo regions 294 and 298. Preferably, the source and drain regions 292 and 296 and halo regions 294 and 298 are generated in a similar manner as was described with respect to FIG. 7 above such that the advantages of the retrograde gate structures with regard to implanting operations are fully realized. Note that separate implant steps (different heavy and light implants) may be associated with each of the two transistor structures shown in FIG. 15 such that different types of transistors (e.g. NMOS and PMOS) result. The different angular implants (N and P) used to create the halos within the transistor devices may be performed using the same tilt angle, or may be done using different tilt angles when possible.

By utilizing the various techniques described herein to create retrograde gate structures that allow for improved implantation techniques and smaller effective gate lengths, numerous advantages are realized over prior art devices that included generally vertical gate structures. As described above, a variety of techniques can be utilized to achieve retrograde gate structures including multilayer gate material deposition, implantation of impurities in a single layer, or the growth of a gate material of variable composition in the vertical direction.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a transistor, comprising the steps of:

providing a substrate having at least a semiconductor portion, the semiconductor portion having a top surface;

forming an insulating layer on the top surface;

forming a polysilicon layer overlying the insulating layer, wherein the polysilicon layer contains an impurity which has an effect on an etch rate of polysilicon, wherein the impurity has a concentration profile which varies with distance from the top surface;

providing a mask over the polysilicon layer to define a gate under the mask, wherein the gate has an upper region near the mask and a lower region near the top surface;

selecting an etching material which has an etch rate of polysilicon which is affected by the impurity;

etching the polysilicon layer around the gate with the etching material so that after etching the polysilicon layer, the upper region of the gate is wider than the lower region of the gate;

performing a halo implant at a tilt angle using the lower region of the gate to mask the halo implant;

performing a relatively light dose implant through the top surface to form a light implant region aligned with an edge of the upper region of the gate;

forming a sidewall spacer adjacent to the gate portion;

performing a relatively heavy dose implant through the top surface using the sidewall spacer to mask the relatively heavy dose implant; and heating the substrate so that the light implant region diffuses to have a relatively small overlap with the lower region of the gate.

2. The method of claim 1, wherein the concentration profile of the impurity varies substantially continuously with distance from the top surface by a plurality of steps of changes in concentration of the impurity.

3. The method of claim 2, wherein the impurity is selected from germanium, carbon, boron, indium, gallium, phosphorus, and arsenic.

4. The method of claim 3, further comprising the step of providing a salicide layer on the gate and aligned with the upper region of the gate so as to be wider than the lower region of the gate.

5. The method of claim 1, wherein the concentration profile of the impurity varies linearly with distance from the top surface.

6. The method of claim 1, wherein the concentration profile of the impurity varies substantially continuously with distance from the top surface by a plurality of steps of changes in concentration of the impurity.

7. The method of claim 1, wherein the impurity is selected from germanium, carbon, boron, indium, gallium, phosphorus, and arsenic.

8. The method of claim 1, further comprising the step of providing a salicide layer on the gate and aligned with the upper region of the gate so as to be wider than the lower region of the gate.

9. The method of claim 1, wherein the concentration profile of the impurity varies linearly with distance from the top surface.

10. A method for forming a transistor, comprising the steps of:

providing a substrate having at least a semiconductor portion, the semiconductor portion having a surface;

forming an insulating layer on the surface;

forming a relatively thin polysilicon layer overlying the insulating layer;

introducing a first impurity of a first concentration in at least a first portion of the relatively thin polysilicon layer, wherein the first impurity has an effect on an etch rate of polysilicon;

forming a relatively thick polysilicon layer on the relatively thin layer of polysilicon;

providing a mask over the relatively thick polysilicon layer to define a first gate under the mask, wherein the first gate has an upper region in the relatively thick polysilicon layer and a lower region in the first portion of the relatively thin polysilicon layer;

selecting an etching material which has an etch rate of polysilicon which is affected by the impurity;

etching the relatively thick and relatively thin polysilicon layers around the first gate with the etching material so that after etching the relatively thick and relatively thin polysilicon layers, the upper region of the first gate is wider than the lower region of the first gate;

performing a first relatively light implant through the surface aligned with an edge of the upper region of the first gate;

forming a first sidewall spacer adjacent to the first gate; and performing a first relatively heavy implant through the surface using the first sidewall spacer to mask the first relatively heavy implant.

11. The method of claim 10, further comprising performing a halo implant at a tilt angle using the lower region of the first gate to mask the halo implant.

12. The method of claim 11, wherein the impurity is selected from boron, indium, gallium, arsenic, and phosphorus.

13. The method of claim 10, further comprising forming a second transistor by:

introducing a second impurity of a second concentration in at least a second portion of the relatively thin polysilicon layer, wherein the second impurity has an effect on the etch rate of polysilicon;

in the step of providing the mask, defining a second gate under the mask, wherein the second gate has an upper region in the relatively thick polysilicon layer and a lower region in the second portion of the relatively thin polysilicon layer;

in etching the relatively thick and relatively thin polysilicon layers around the first gate, etching the relatively thick and relatively thin portions around the second gate with the etching material so that after etching the relatively thick and relatively thin polysilicon layers, the upper region of the second gate is wider than the lower region of the second gate;

performing a second relatively light implant through the surface aligned with an edge of the upper region of the second gate;

forming a second sidewall spacer adjacent to the second gate; and performing a second relatively heavy implant through the surface using the second sidewall spacer to mask the second relatively heavy implant.

14. The method of claim 13, further comprising performing a first halo implant at a first tilt angle using the lower region of the first gate to mask the first halo implant and performing a second halo implant at a second tilt angle using the lower region of the second gate to mask the second halo implant.

15. The method of claim 14, wherein the first angle and the second angle are the same.

16. The method of claim 15, wherein the first impurity is selected from arsenic and phosphorus and the second impurity is selected from boron, indium, or gallium.

* * * * *